(12) United States Patent
Bensaoula et al.

(10) Patent No.: US 9,691,933 B2
(45) Date of Patent: Jun. 27, 2017

(54) RADIATION AND TEMPERATURE HARD MULTI-PIXEL AVALANCHE PHOTODIODES

(71) Applicant: University of Houston System, Houston, TX (US)

(72) Inventors: Abdelhak Bensaoula, Houston, TX (US); David Starikov, Houston, TX (US); Rajeev Pillai, Manvel, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 107 days.

(21) Appl. No.: 14/667,024

(22) Filed: Mar. 24, 2015

(65) Prior Publication Data

US 2015/0280045 A1   Oct. 1, 2015

Related U.S. Application Data

(60) Provisional application No. 61/970,837, filed on Mar. 26, 2014.

(51) Int. Cl.
*H01L 33/06* (2010.01)
*H01L 29/06* (2006.01)
(Continued)

(52) U.S. Cl.
CPC ...... *H01L 31/1075* (2013.01); *H01L 27/1446* (2013.01); *H01L 31/03044* (2013.01); *H01L 31/035236* (2013.01); *H01L 31/1856* (2013.01)

(58) Field of Classification Search
CPC ............ H01L 31/1075; H01L 27/1446; H01L 31/03044; H01L 31/1856; H01L 31/035236
See application file for complete search history.

(56) References Cited

U.S. PATENT DOCUMENTS

| 4,659,930 A | 4/1987 | Johnson et al. |
| 2008/0001139 A1 | 1/2008 | Augusto |

(Continued)

FOREIGN PATENT DOCUMENTS

| EP | 1808712 A2 | 7/2007 |
| WO | 2004/061923 A1 | 7/2004 |

(Continued)

OTHER PUBLICATIONS

Akihiko Kikuchi et al., "InGaN/GaN Multiple Quantum Disk Nanocolumn Light-Emitting Diodes Grown on (111) Si Substrate" Japanese Journal of Applied Physics vol. 43, No. 12A, 2004, pp. L 1524-L 1526.*

(Continued)

*Primary Examiner* — Thomas L Dickey
*Assistant Examiner* — Damon Hillman
(74) *Attorney, Agent, or Firm* — Jackson Walker LLP

(57) ABSTRACT

The structure and method of fabricating a radiation and temperature hard avalanche photodiode with integrated radiation and temperature hard readout circuit, comprising a substrate, an avalanche region, an absorption region, and a plurality of Ohmic contacts are presented. The present disclosure provides for tuning of spectral sensitivity and high device efficiency, resulting in photon counting capability with decreased crosstalk and reduced dark current.

23 Claims, 12 Drawing Sheets

(51) Int. Cl.
*H01L 33/24* (2010.01)
*H01L 33/32* (2010.01)
*H01L 29/20* (2006.01)
*H01L 31/107* (2006.01)
*H01L 27/144* (2006.01)
*H01L 31/0304* (2006.01)
*H01L 31/0352* (2006.01)
*H01L 31/18* (2006.01)

(56) References Cited

U.S. PATENT DOCUMENTS

| | | |
|---|---|---|
| 2009/0173976 A1 | 7/2009 | Augusto |
| 2011/0291109 A1 | 12/2011 | Wraback et al. |
| 2012/0141799 A1 | 6/2012 | Kub et al. |
| 2012/0315744 A1 | 12/2012 | Cheng |
| 2013/0207075 A1 | 8/2013 | Myers et al. |
| 2014/0048122 A1* | 2/2014 | Fogel ................ H01L 31/03522 136/249 |
| 2015/0108428 A1* | 4/2015 | Shatalov ............. H01L 21/0242 257/18 |

FOREIGN PATENT DOCUMENTS

| | | |
|---|---|---|
| WO | 2009/140387 A2 | 11/2009 |
| WO | 2009/140395 A2 | 11/2009 |
| WO | 2010/031011 A2 | 3/2010 |
| WO | 2012/104798 A2 | 8/2012 |

OTHER PUBLICATIONS

Kikuchi et al. (Kikuchi) "InGaN/GaN Multiple Quantum Disk Nanocolumn Light-Emitting Diodes Grown on (111) Si Substrate" Japanese Journal of Applied Physics vol. 43, No. 12A, 2004, pp. L 1524-L 1526.*

Korean Intellectual Property Office; International Search Report and Written Opinion; PCT Application No. PCT/US2015/022277; Jun. 23, 2015.

* cited by examiner

RADIATION AND TEMPERATURE HARD MULTI-PIXEL AVALANCHE PHOTODIODES

This application claims priority to U.S. Provisional Patent Application Ser. No. 61/970,837, entitled "Radiation and Temperature Hard Multi-Pixel Avalanche Photodiodes," filed Mar. 26, 2014, the entire content of which is hereby incorporated by reference.

This invention was made with support, in parts, of the NASA Small Business Innovation Research program. The government may have certain rights in the invention.

BACKGROUND

The present disclosure relates generally to avalanche photo detector devices, and more specifically to the structure and method of making a radiation and temperature hard avalanche photodiode device.

Among the available compound semiconductor materials, III-Nitride materials, AlGaN, GaN, and InGaN are chosen as the best candidates for the development of radiation hard Avalanche Photodiodes (APDs). Recent advances in GaN power electronics and high electron mobility transistor technologies allow for future fabrication of transistor gates directly on high quality GaN wafers. This would provide for a much more robust radiation hard technology with high data capture speeds.

Micro channel plates (MCPs), micro sphere plates (MSPs), and multi-dynodes are representatives of the most established detector technology class. In particular, MCPs are widely utilized to detect photons, electrons, or ions in numerous application areas. Photon detection is necessary for astronomical observatories, fluorescent microscopy, night vision, security monitoring, and nuclear scintillation detection. Time of flight (TOF) mass spectrometry is a major tool in charged particle detection and is currently used in many applications including residual gas monitoring, biomass spectrometry, aerosol monitoring, and plasma sampling.

Photomultiplier tubes (PMT) have also served as excellent photon counting devices with sensitivity ranging from UV to IR. The efficiency of PMTs is typically in the range of 10% to 40% and is limited by the efficiency of the photoelectron emission from the photocathode. The darkcount events can be as low as few events per second, particularly if the PMT is cooled. The challenges of working with PMTs are that they require vacuum in order to operate and even low resolution imaging arrays are bulky, mechanically and thermally unstable, and expensive. The work principles of a single photon avalanche photodiode (SPAD) is very similar to the PMT: the incident photon generates electron-hole pairs, which are then accelerated under a high electric field in the avalanche region, where they undergo impact ionization and multiply. Thus high ionization rates lead to higher probability of avalanche which in turn improves the photon detection efficiency (PDE).

The APD structure could be grown on silicon wafers to take advantage of direct integration with established silicon technology. However, silicon is prone to false events under high radiation environments. In addition, fabricating transistor gates prior to growing the APD structures would not be possible, due to the high growth temperatures of III-Nitrides.

The benefits offered by the employment of AlGaN material for avalanche ionization based devices have been recently explored. The calculated electron and hole ionization coefficients for $Al_xGa_{1-x}N$ materials are shown in FIG. 1. While the electron and hole ionization coefficients are very close for GaN, increasing the Al composition in $Al_xGa_{1-x}N$ shows drastic increase of the electron ionization coefficients over the hole ionization coefficients. While electron and hole ionization are equally important for fast response of avalanche photodiodes, slight differences for improvement of the reset time in Geiger-mode avalanche photodiodes are expected at higher electron ionization coefficients. In addition, since AlGaN bandgap is higher than that of GaN and is increasing with the increase of the Al content, employment of AlGaN is beneficial as band-to-band tunneling currents are expected to reduce with increasing bandgap.

Several groups have fabricated GaN and AlN avalanche photodiodes with dark currents below $10^{-11}$ A at −150 V for AlN APD and below $10^{-7}$ A at −60 V for GaN APD. The advantages of $Al_xGa_{1-x}N$ materials have already been demonstrated in solar-blind AlGaN p-i-n photodiodes with dark current densities as low as $3\times10^{-11}$ A/cm$^2$ with reverse breakdown voltages exceeding 40 V. The low dark currents are attributed to lower defect density and the wide bandgap of $Al_{0.45}Ga_{0.55}N$ absorber layer.

Nevertheless, obtaining high quality III-Nitride layers with low defect density is still a challenge due to the lack of low cost lattice matched substrates. Several groups have demonstrated high quality GaN films grown on sapphire substrates using techniques, such as epitaxial layer overgrowth (ELO) and selective area growth (SAG), with the lowest defect densities ranging between $10^9$ to $10^6$ cm$^{-2}$. Many devices including light emitting diodes (LEDs) have benefited significantly from such techniques. Recent developments in nanotechnology, specifically nanowires or nanocolumns, have shown the possibility to reduce the defect densities further.

It is expected that the III-Nitride nanocolumns could be defect free due to the strain management in the one-dimensional structure, allowing for the possibility of fabricating devices that approach their theoretical efficiency.

In the case of avalanche photodiodes, the zero defect densities will result in lower dark current from reduced tunneling and thermal currents. Typically 2D films of $Al_xGa_{1-x}N$ grown on silicon have an inherent defect density exceeding $10^6$ cm$^{-2}$ Recently, several groups have shown well aligned stress free single crystalline III-Nitride nanowires grown spontaneously on silicon. The nanowires are generated due to lattice mismatch strain energy between the III-Nitride nanowires and the silicon substrates, and the high surface energy of the nitrogen stabilized InN and GaN surfaces. Defect free $Al_xGa_{1-x}N$ nanowires have been demonstrated by Allah et al., and room temperature LED devices emitting at 1.46 µm were demonstrated on GaN nanocolumns capped with InGaN p-n junction LEDs. TEM cross-sectional images do not show any visual defects and photoluminescence studies indicate possible defect free films for these nanocolumns.

The generally accepted growth mechanism of the III-Nitride nanowires is by side wall diffusion of the adatoms during the growth process. There are two stages to the growth of the nano columns, first the nucleation stage of GaN islands followed by the growth of the GaN nanowire. The nucleation stage determines the nanocolumn size and density, which is in turn controlled by the adatom flux arriving at the substrate and the substrate temperature. Substrate temperature controls the adatom diffusion length both on the substrate and along the nanowire sidewalls. Thus it has been shown that the nanowire separation is about the twice the diffusion length of the adatom on the substrate. The second stage is the vertical growth of the III-Nitride nanowire, and again is dependent on the adatom diffusion. For instance in the case of nanowires that started off as GaN and later switched to AlGaN, it was noted that the diameter of the nanowires increased. Thus while not trivial, it is possible to control the diameter of the GaN or AlGaN nanowires by either varying the adatom flux density or varying the temperature of the substrate. The control over the nanocolumn diameter during the growth makes it possible to realize conditions when nanocolumns coalesce, forming a gap free mushroom like surface.

SUMMARY

The present disclosure relates generally to avalanche photo detector (APD) devices, and more specifically to the structure and method of making a radiation and temperature hard avalanche photodiode device.

The disclosed APD device is based on defect free nanocolumnar (NC) structures that can be grown on ultralow defect GaN wafers using Molecular Beam Epitaxy (MBE). Recent advances in the growth of high quality bulk GaN wafers allow for achievement of ultralow (~$10^4$/cm$^2$) defect densities.

In one embodiment, the radiation and temperature hard photon counting avalanche photodetector device comprises a substrate having a pixel matrix of transistor structures on a top surface of the substrate, an avalanche region above the substrate comprising doped coalesced nanocolumns or nanowires having a matching pixel matrix, an absorption region with a matching pixel matrix further comprising a grading layer on top of the avalanche region, a superlattice layer on top of the grading layer, a capping layer on top of the superlattice layer, and a plurality of Ohmic contacts that provide individual addressing to the transistor and avalanche photodiode structure pixels.

The present disclosure also relates to a method for avalanche photo detector structure fabrication that provides for tuning of spectral sensitivity and high device efficiency, resulting in photon counting capability with decreased crosstalk and reduced dark current (leakage current).

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which.

DETAILED DESCRIPTION OF PREFERRED EMBODIMENTS

Figure 1:
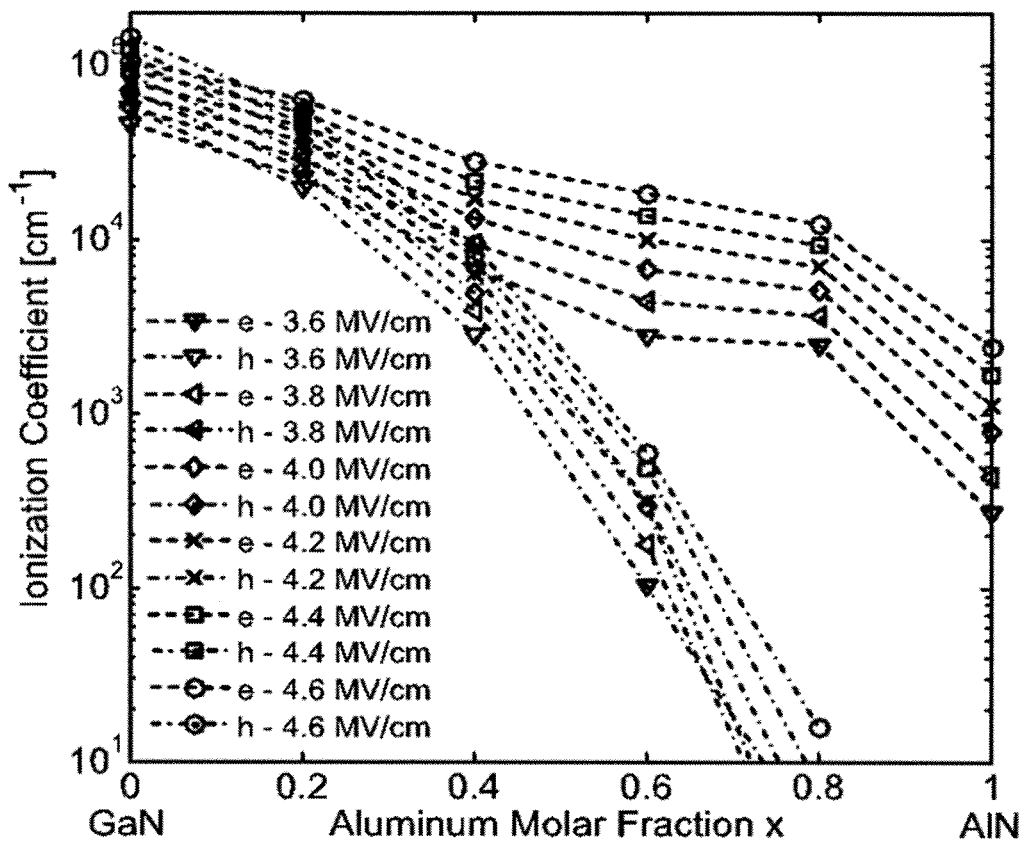
FIG. 1 shows electron and hole ionization coefficients in the Al$_x$Ga$_{1-x}$N material system with varying electric fields.

In the description that follows, alike parts are marked throughout the specification and drawings with the same reference numerals. The drawing figures might not be to scale and certain components can be shown in generalized or schematic form and identified by commercial designations in the interest of clarity and conciseness.

Avalanche Photodiode Device

In one exemplary embodiment, the avalanche photodiode (APD) device structure consists of two major regions: the photon absorption region, where absorbed photons generate electron/hole pairs, and the avalanche region, where generated electrons are multiplied as result of impact ionization.

Figure 2:
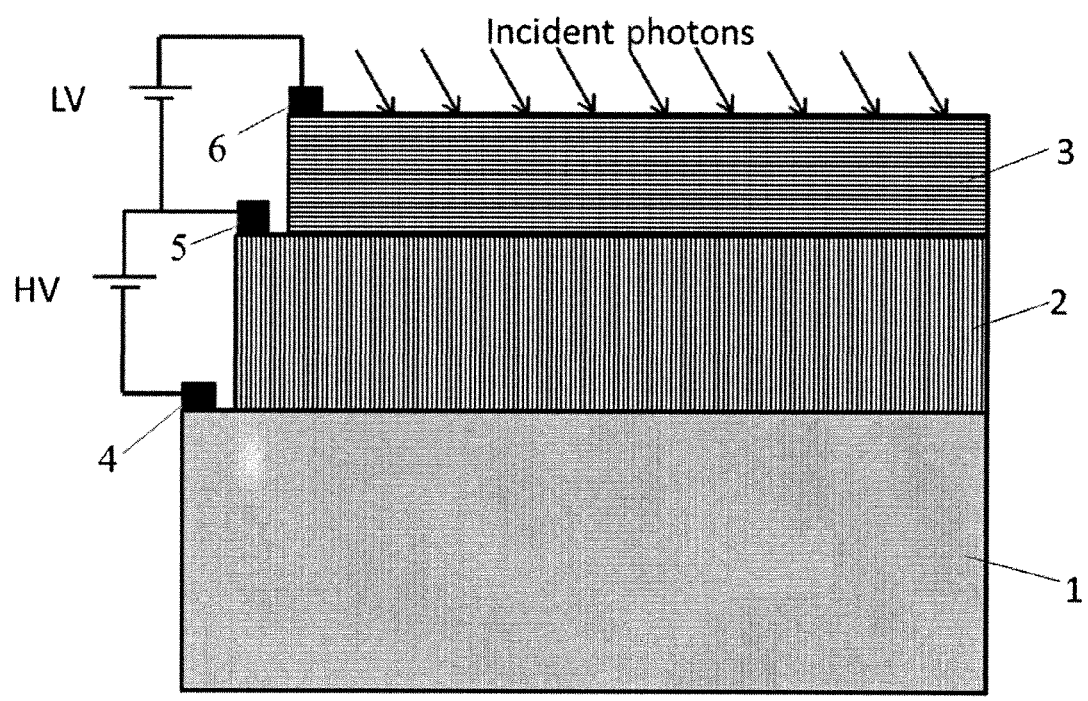
FIG. 2 shows a side view of a device in accordance with an exemplary embodiment of the present disclosure.

A schematic of an example of the APD device structure is shown in FIG. 2, starting with the bulk p-type GaN substrate (1), followed by a p-type avalanche region (2) composed of p-GaN and p-AlGaN nanocolumns (NC), and n-type absorption region (3) composed of n-GaN and n-InGaN layers. Incident photons with energies lower than the bandgap of GaN (~3.34 eV) pass through the n-GaN layers, but are absorbed in the n-InGaN layers of the absorption region.

In one embodiment of the present disclosure, the substrate (1) can be a doped radiation and temperature hard semiconductor material such as silicon, sapphire, or any suitable alternative. The substrate (1) can have a top substrate layer comprised of GaN, for example. The substrate, top substrate layer, and nanocolumns (NC) can have a threading dislocation density $\leq 10^8$ cm$^{-2}$.

Electron hole pairs are generated in the absorber region (3) where they drift into the avalanche region (2) by an electric field generated from a low voltage (LV) direct bias applied between Ohmic contacts (5) and (6). The avalanche region (2) consists of a p-GaN/p-AlGaN NC structure. Here, the electrons undergo impact ionization and generate a large number of electron-hole pairs under the field from a high voltage (HV) reverse bias applied between Ohmic contacts (4) and (5).

Figure 3:
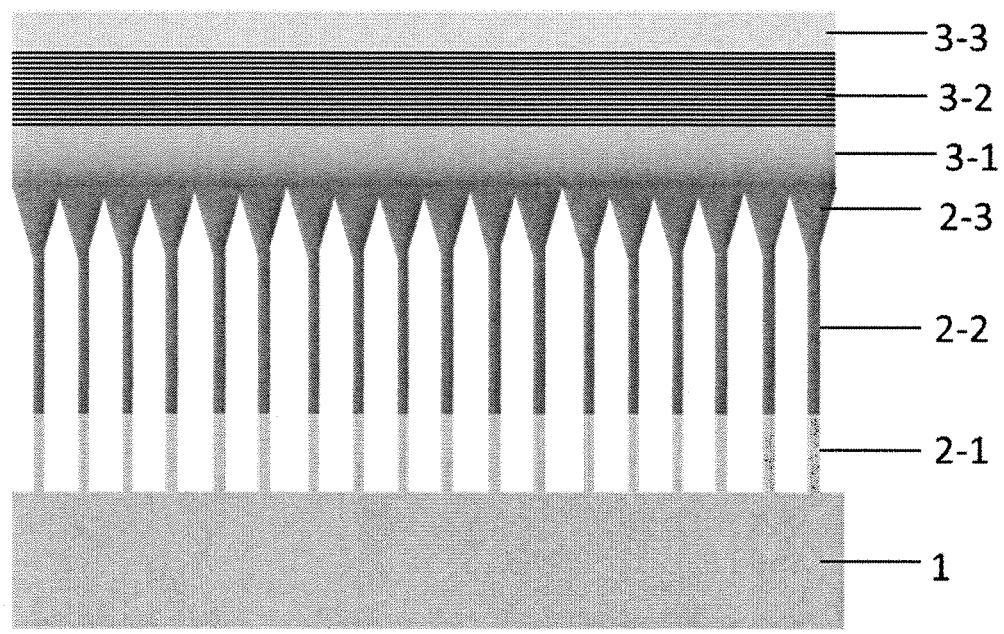
FIG. 3 shows a detailed side view of a device in accordance with an exemplary embodiment of the present disclosure.

A more detailed structure of the avalanche and absorption region layers in an exemplary embodiment of the device is shown in the FIG. 3. The avalanche region (2) grown on a bulk p+-GaN substrate consists of p-GaN nanocolumns (2-1) that extend into p-AlGaN nanocolumns (2-2), that form a coalesced layer (2-3) on the top. A grading from i-AlGaN to n+-GaN layer (3-1) is grown on the top of the coalesced p-AlGaN nanocolumns as a first part of the absorption region. A n-GaN/n-InGaN supperlattice structure layer (3-2) is grown as a second part of the absorption region, and an n-GaN capping layer (3-3) is grown as a third part of the absorption region.

The doping concentration of the nanocolumns (2-2) is in the range of about ~$10^{14}$-$10^{18}$ cm$^{-3}$. The doping concentration of the grading (3-1) and the superlattice structure layer (3-2) is in the range of about ~$10^{16}$-$10^{18}$ cm$^{-3}$. The doping concentration of the capping layer (3-3) is in the range of about ~$10^{18}$-$10^{19}$ cm$^{-3}$.

Device Fabrication Method

The NC structures are preferably produced by using selective area growth (SAG) using a metal mask deposited on bulk p+-GaN substrates (that also serve as a bottom contact layer) prior to the MBE growth. The Mg-doped ~300 nm thick GaN nanocolumns are grown in the open mask areas. The growth of GaN nanocolumns is switched to growth of AlGaN nanocolumns by adding a considerable Al molecular flux into the MBE chamber and adjusting the substrate temperature. From previous experiments on AlGaN film growth, Al to Ga flux ratios are already in place that are necessary in order to obtain $Al_{0.45}Ga_{0.55}N$ composition. The same ratio is applied to the intrinsically n-type $Al_{0.45}Ga_{0.55}N$ NC growth. In order to reduce the spontaneous polarization field formed at the GaN/AlGaN interface, the switching from GaN NC growth to $Al_{0.45}Ga_{0.55}N$ NC growth is performed gradually, by slowly increasing the Al flux from 0 to a pre-determined value. About 2 μm thick $Al_{0.45}Ga_{0.55}N$ NCs are grown for the avalanche region, and then the temperature is slightly reduced to cause the NCs to coalesce at the top. Dropping the temperature reduces the Al atoms diffusion length thereby broadening the nanocolumn diameter and making the NC coalesce. Next, the $Al_{0.45}Ga_{0.55}N$ layer is graded back to GaN, but Si doped to form the n-type field stop layer for the photon absorption region. Similarly, based on our previous experiments, an n-type $In_{0.17}Ga_{0.83}N$/GaN superlattice structure capped with an n+-GaN layer (as the optical window and top contact layer) is grown to complete the absorption region part of the APD device.

Reactive ion etching (RIE) is used to expose three areas for deposition of Ohmic contacts (4), (5), and (6) shown in FIG. 2: the p+-GaN bulk substrate, the n+-GaN layer grown on the top of the coalesced AlGaN NC, and top n+-GaN capping window layer, respectively. The metal contacts are deposited by e-beam or other applicable metal evaporation or sputtering method.

Figure 4:
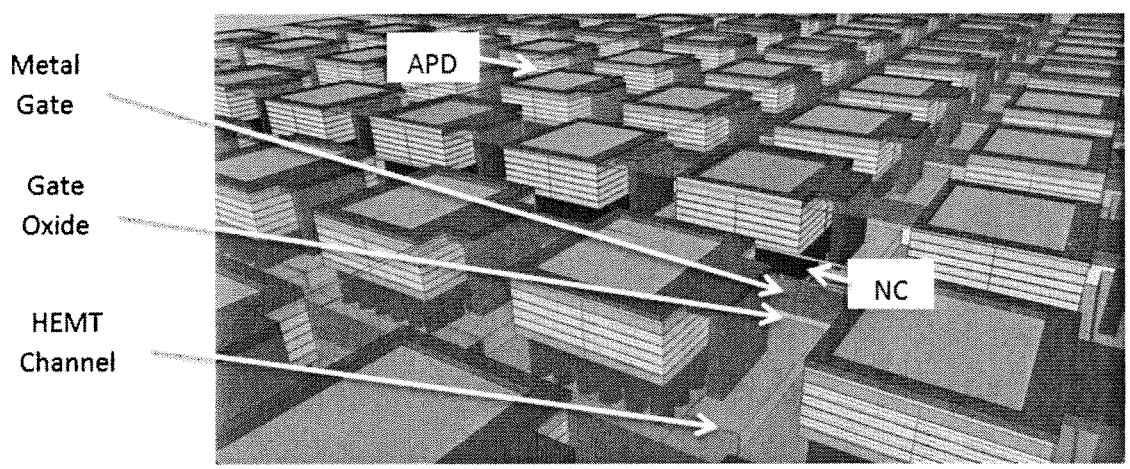
FIG. 4 shows a multi-pixel avalanche photodetector array in accordance with an exemplary embodiment of the present disclosure.

In order to fabricate integrated APD controls from radiation hard materials, AlGaN/GaN HEMT transistors with areas designated for integration with APD devices are grown prior to the APD growth on bulk GaN substrate by using MBE. Transistor gates for the read out electronics will be fabricated around these areas as shown in FIG. 4. The pink lines correspond to the metal gates, while the bright green lines correspond to the HEMT channel. An oxide layer deposited by plasma enhanced chemical vapor deposition is patterned to reveal areas for the growth of the APD devices shown as the cube mesas in FIG. 4.

The device avalanche and absorption region thickness and doping profile can be optimized to improve Photon Detection Efficiency (PDE) and reduce Dark Count Rate (DCR). DCR is primarily controlled by the tunneling and thermal currents in different sections of the device. Having a low dark count allows the application of a higher bias voltage to obtain a higher avalanche ionization probability. A quick estimate of the avalanche layer thickness to have an avalanche ionization condition is if the "$W_A^*$ ionization coefficient≥1", for different electric fields. Donnelly et al. have presented a thorough approach to calculate both DCR and PDE for similar structures based on InGaAsP—InP Geiger-mode avalanche photodiodes. The DCR equation for the structure not including the graded GaN/AlGaN layer is shown below. Here similar calculations are used to determine the absorption and avalanche regions. From the analysis the optimum operation conditions are selected for the APD.

$$DCR = \int_0^{W_{AlGaN}} \left( \left( \frac{n_{iAlGaN}}{\tau_{AlGaN}} \right) + \left( \frac{J_{tun_{AlGaN}}}{q} \right) \right) PA(x) dx + PA(0) \left( \frac{n_{iInGaN}}{\tau_{InGaN}} \right) W_{InGaN} + \int_0^{W_{InGaN}} \left( \frac{J_{tun_{InGaN}}(x)}{q} dx \right),$$

where W AlGaN is the width of the AlGaN avalanche region, n, is the doping concentration, $W_{InGaN}$ is the width of the InGaN region, is the tunneling current, and PA is the probability of avalanche ionization.

Details on the preferred steps for fabrication of embodiments of the APD device are given below:

The growth of GaN/$Al_{0.45}Ga_{0.55}N$ nanocolumnar structures requires a metal (such as TiN or any other suitable metal) mask with nanometer sized openings deposited on the bulk GaN substrate. The AlGaN NC growth on GaN can be performed using titanium layer assisted selective area growth (SAG) method. As the active nitrogen is introduced in the MBE chamber, the Ti mask on the heated substrates chemically converts into TiN. While spontaneous GaN NC have been grown on GaN films, their periodicity and order remain a challenge. Moreover, the close-packed nature of the spontaneous NCs make coalescence along the sidewalls possible, thereby creating stacking faults that are detrimental to the avalanche region. Several reports have already demonstrated various nanocolumn based devices, including red, green, and blue InGaN LEDs fabricated using SAG technique. Electron beam lithography is employed to pattern a thin (<100 Å) titanium film deposited on a GaN wafer. In order to achieve this, a thin 100 Å Ti layer is deposited using e-beam evaporation. Next, PMMA is spin coated onto the Ti coated wafer and loaded into a JEOL JBX 5500FS eBeam writer. An array of 100, 150, 200, and 300 nm circular openings are then patterned on the PMMA coating. The patterns are generated in sections of 2 mm×2 mm areas on the p-GaN/Sapphire wafer. This approach allows for investigation of the effect of aperture openings on the nanocolumn morphology. The optimal mask aperture geometry is confirmed by XRD scans performed over the grown nanocolumns.

Prior to growing the NCs, the Ti layer is etched through the PMMA mask using dilute HCl acid and then cleaned using standard cleaning procedures. The patterned sample is loaded into the MBE chamber where the samples are degassed at temperatures of 1000-1100° C., followed by nitridation of the Ti mask using the uni-bulb $N_2$ plasma source. The selectivity of III-V growth in the nanohole vs on the Ti mask has been reported to depend primarily on the Ga diffusion length. Thus key parameters to control the NC growth would be growth temperatures in the range of 850-950° C., and lower Ga flux needs to be applied to keep the sample surface nitrogen-rich. Direct growth of $Al_{0.45}Ga_{0.55}N$ NCs on GaN layers creates a high possibility for generating dislocations. Thus, it is used a unique approach, where the growth starts with about 300-500 nm thick GaN NCs and then the composition is gradually switched from GaN to $Al_{0.45}Ga_{0.55}N$ by activating and controlling the Al flux and substrate temperature.

The growth of $Al_xGa_{1-x}N$ nanocolumns on top of the GaN nanocolumns presents a challenge of its own. The Al adatom diffusion length is smaller than that of Ga. If same conditions as for the GaN nanocolumn growth are applied, the $Al_xGa_{1-x}N$ nanocolumns will grow on the side before the adatoms get a chance to reach their top surface. This will increase diameter of the upper part of the nanocolumns ultimately leading to their coalescence. The height and diameter of the starting GaN nanocolumn should be maintained by controlling the growth temperature and growth time at predetermined Ga and N fluxes. The growth temperature will have to be increased for the growth of $Al_xGa_{1-x}N$ nanocolumns, which in turn would increase the Al adatom diffusion length. However, once the nanocolumns are longer than the diffusion length or desired length (1-2 μm), the substrate temperature should be lowered to increase the diameter at the top of the nanocolumns to cause their coalescence. The growth conditions should be optimized by using the primary variables, such as: Al and Ga fluxes, $N_2$ plasma source power, and substrate temperature.

After each of the above growths, I-V measurements can be carried out to determine the breakdown voltage variation depending on the NC diameters and lengths. In order to do that, once the NCs are grown on GaN and all material characterization experiments are completed, the grown nanocolumns can be spin coated with PMMA used as a filler between the NCs. Oxygen plasma is used to ash the PMMA top layer in order to expose the top of the NCs. Next, metal contacts should be deposited in order to provide biasing and signal acquisition.

Figure 5:
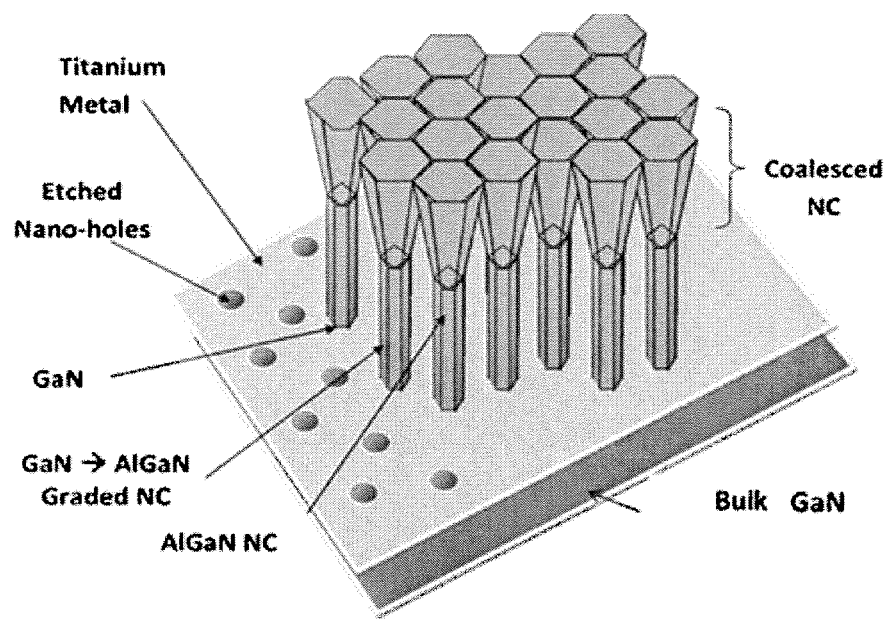
FIG. 5 shows a perspective view of the coalesced nanocolumns in accordance with an exemplary embodiment of the present disclosure.

In order to optimize the $Al_xGa_{1-x}N$ NC coalescence, the following considerations should be used. Lateral coalescence of NC arrays have been demonstrated using PAMBE and MOCVD. It is expected that at the point of coalescence of two NCs stacking faults (SF) are generated. In this particular structure, the SF would not affect the performance of the device, since the avalanche region is within the NC and is not connected to the coalesced layer. FIG. 5 illustrates the coalesced NC structures. The optimized 2D InGaN supperlattice (SL) structure is grown on the top of the coalesced AlGaN-NC layer. The stacking faults (SF) generated at the interface of the NC coalescence sites are expected to naturally propagate through the InGaN absorber layer. However, the unique feature of this approach is that the high defect density of the absorber layer would not alter the performance of the proposed device. This is because the SF would propagate along the c-plane of the layers, thus creating grains that will grow to reach the surface. Each grain will exhibit excellent crystalline quality and is electrically connected to only one avalanche AlGaN NC. Thus typically destructive leakage currents are only present at the grain interface, between the coalesced structures and do not travel into the NC avalanche region.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

Examples

Figure 6:
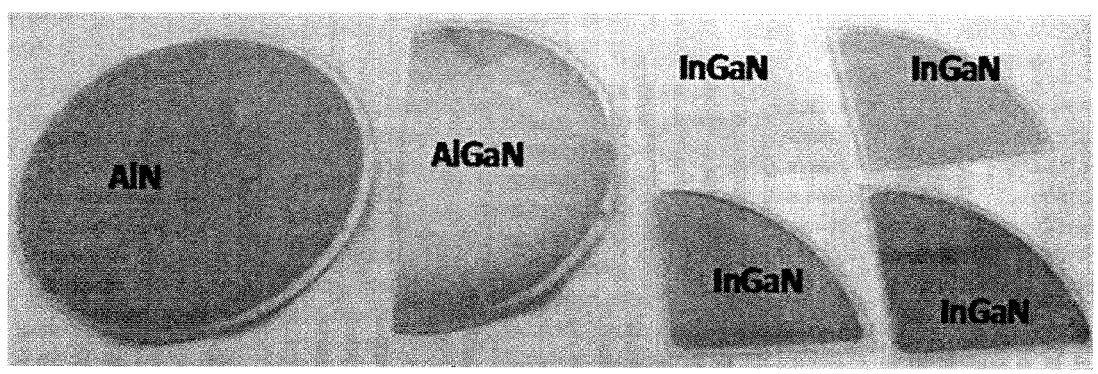
FIG. 6 shows device quality III-Nitride films grown on silicon and sapphire substrates.

Device quality AlN, AlGaN, and InGaN films were grown on silicon and sapphire substrates as shown in FIG. 6.

Figures 7A, 7B:
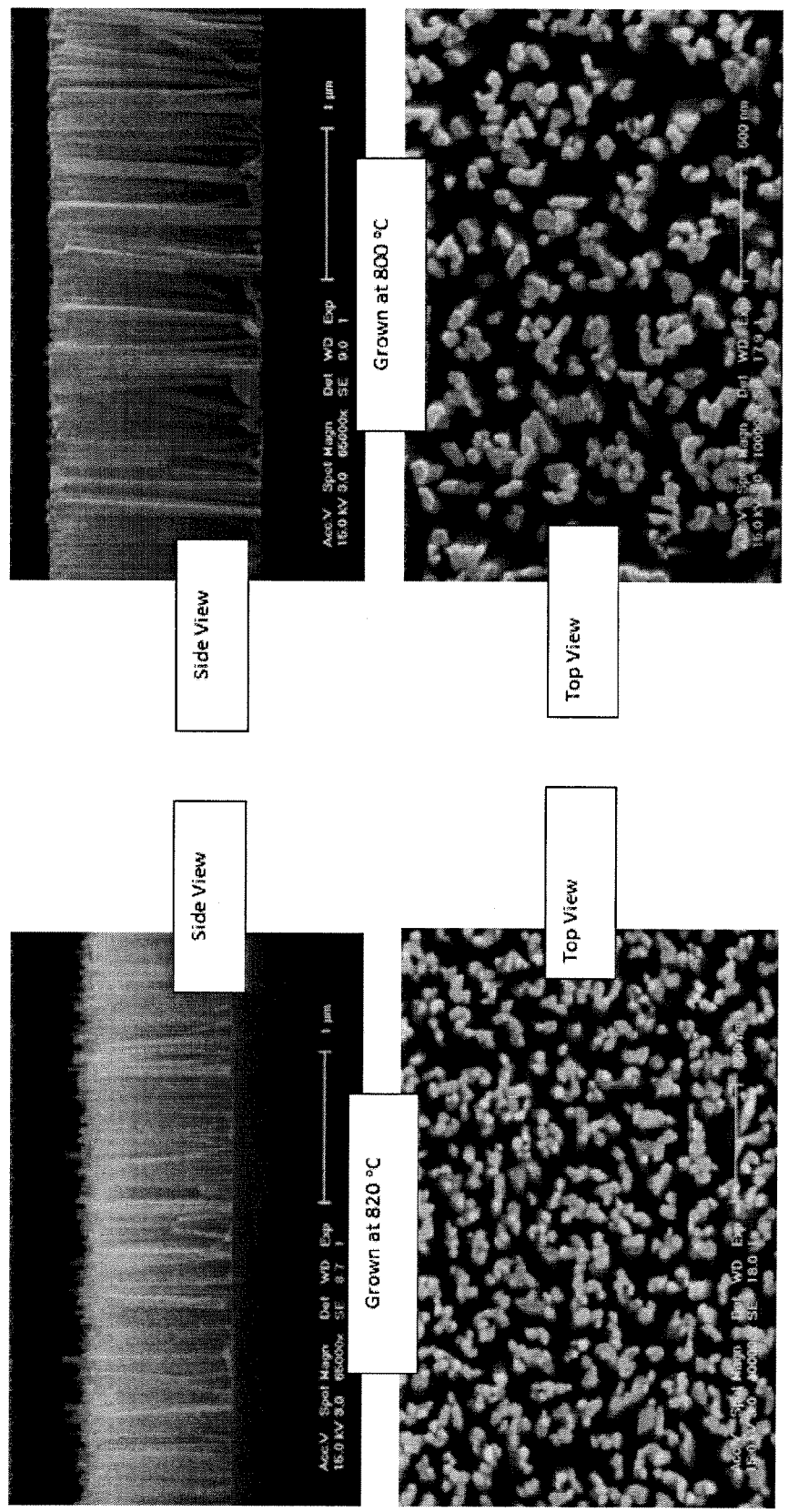
FIG. 7a shows a top view and a side view of gallium nitride nanocolumns spontaneously grown on silicon substrates at about 820° C.
FIG. 7b shows a top view and a side view of gallium nitride nanocolumns spontaneously grown on silicon substrates at about 800° C.

GaN and AlGaN nanocolumns (NC) were spontaneously grown on (111) silicon. FIGS. 7a and 7b show GaN NC grown on silicon at two temperature regimes, at higher temperatures, the resulting NCs have smaller diameters and shorter heights (FIG. 7a) and for lower temperatures the NCs have higher diameters and heights (FIG. 7b).

Figure 8:
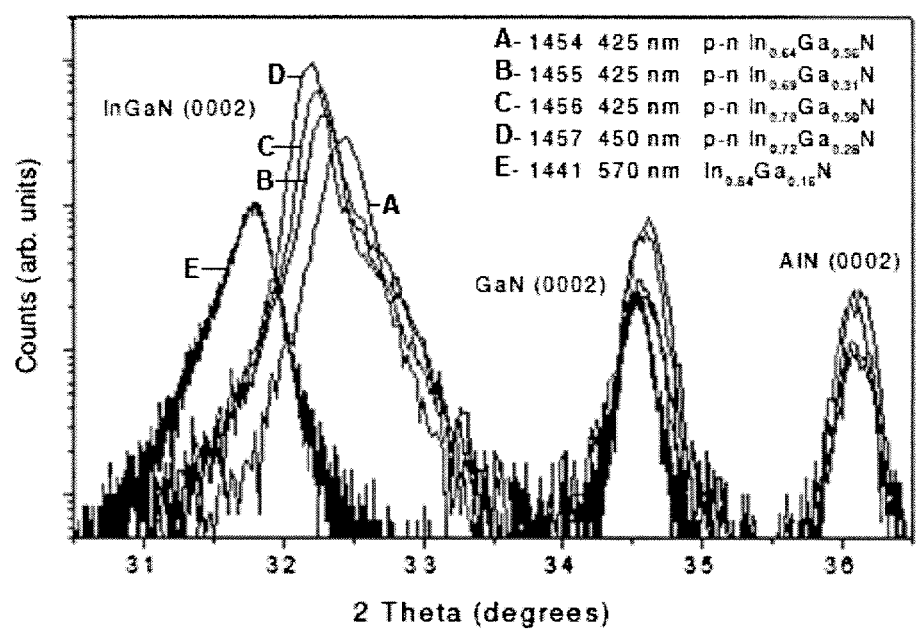
FIG. 8 shows x-ray data for p-n junction InGaN devices of various indium composition levels, the devices having a total thickness of about 425-450 nm.

High indium content p-n junction samples and Schottky barrier photodiodes were demonstrated on Silicon. The x-ray data for some of these samples is shown in FIG. 8. Presence of only the (0002) InGaN peak is evidence of the high quality single crystalline InGaN layers with no detectable phase separation.

Figure 9:
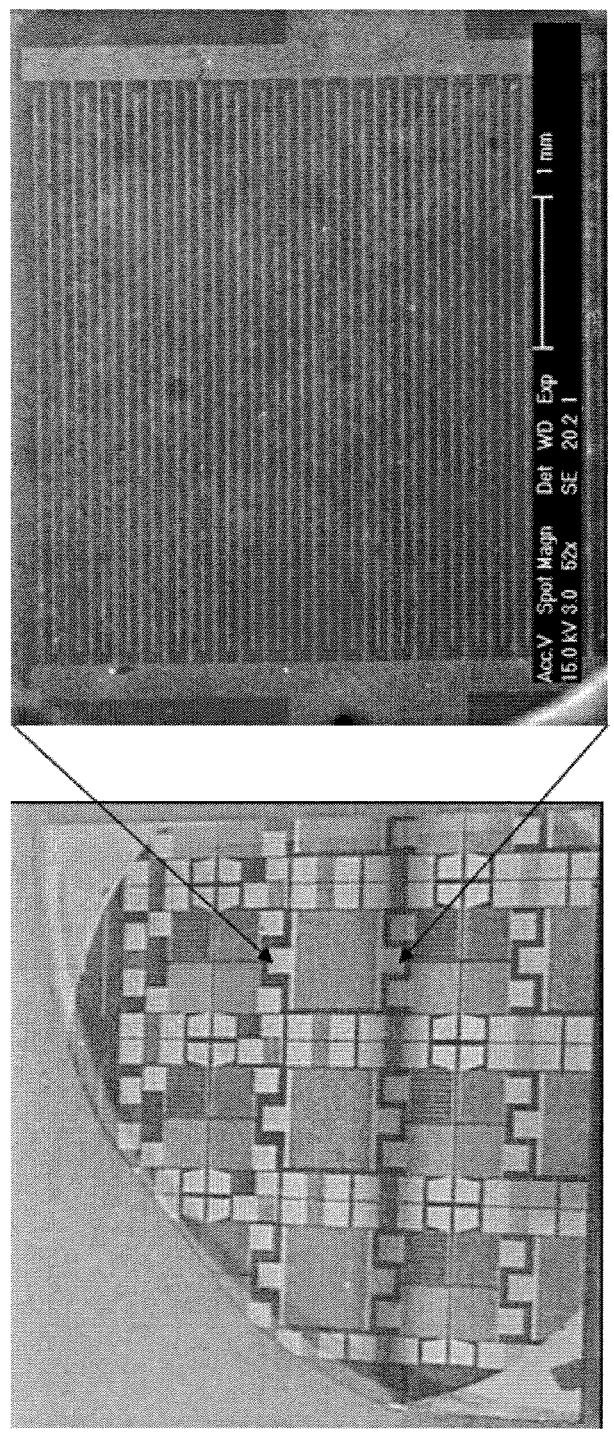
FIG. 9 shows front illuminated photodiode structures.
Figure 10:
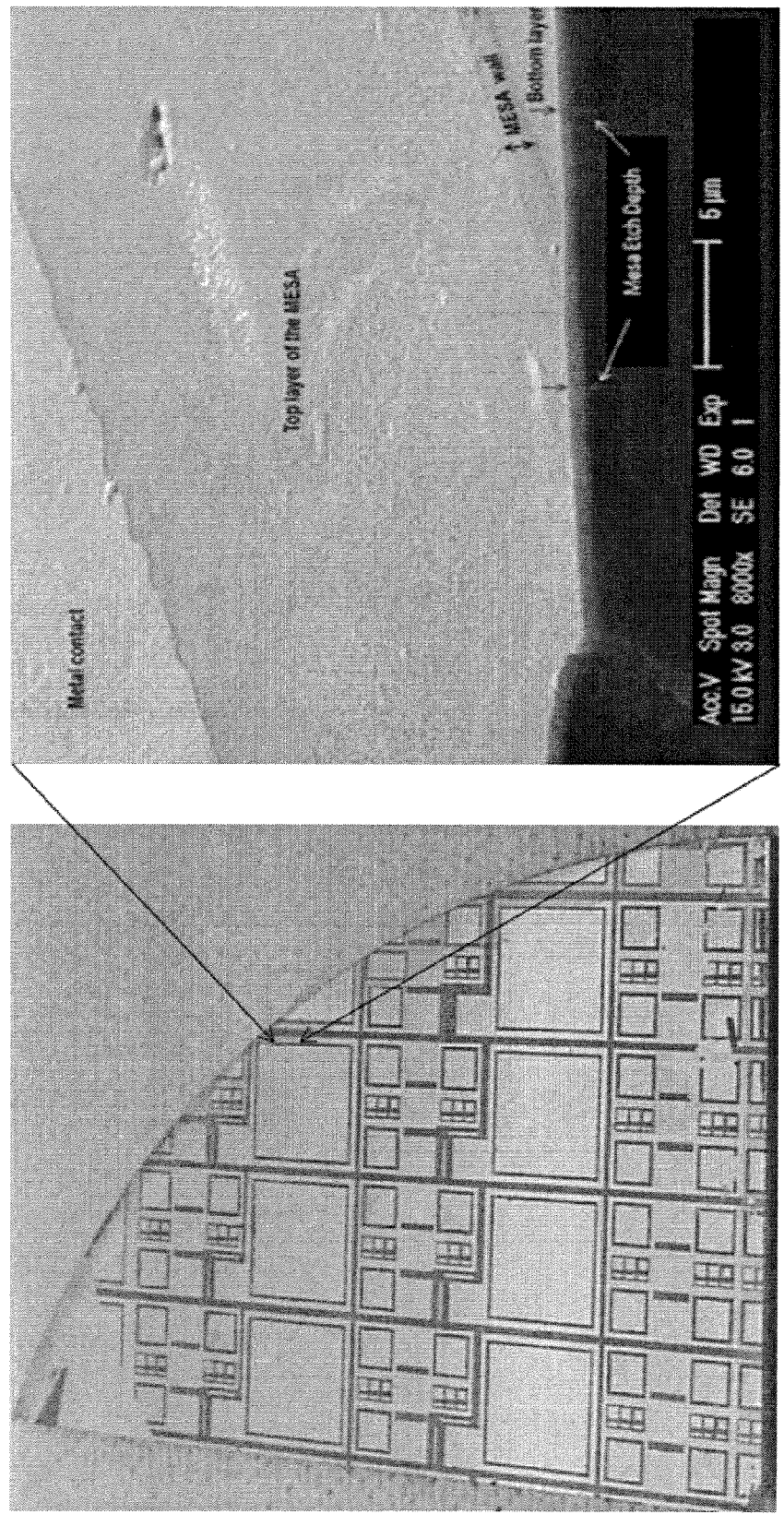
FIG. 10 shows back illuminated photodiode structures.
Figure 11B:
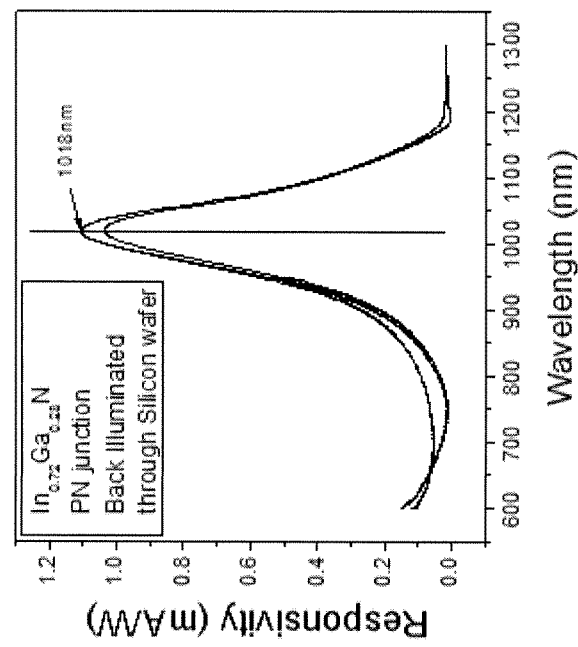
FIG. 11b shows back illuminated performance of In$_{0.72}$Ga$_{0.28}$N p-n junction device fabricated on a silicon substrate.
Figure 11A:
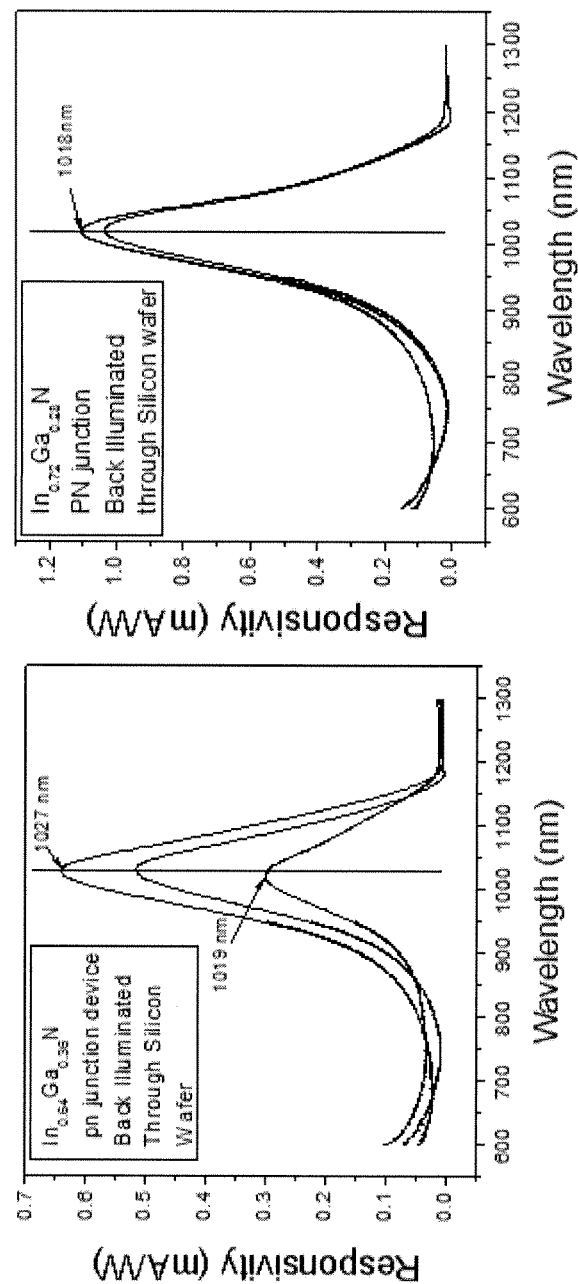
FIG. 11a shows back illuminated performance of In$_{0.64}$Ga$_{0.36}$N p-n junction device fabricated on a silicon substrate.

FIG. 9 shows the fabricated photodiode structures for front illumination, and FIG. 10 shows the back illuminated structure grown on silicon. The back illuminated structures used silicon as a passive filter creating the narrow band IR response. FIGS. 11a and 11b show photoresponse of the photodiodes in a narrow IR band, determined by the silicon thickness and the InGaN absorption band edge.

Figure 12B:
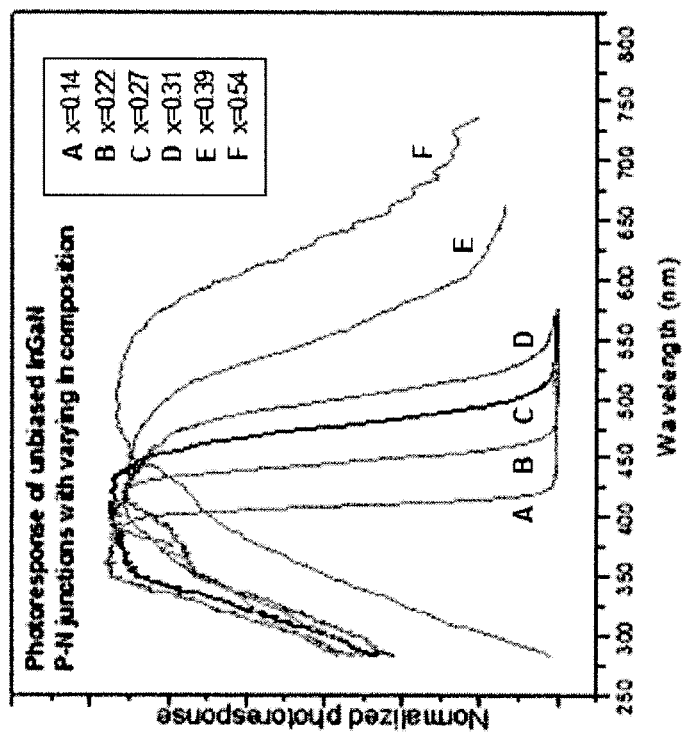
FIG. 12b shows normalized photoresponse measurements of unbiased In$_x$Ga$_{1-x}$N p-n junction devices with indium compositions varying from $0 \leq x \leq 1$.
Figure 12A:
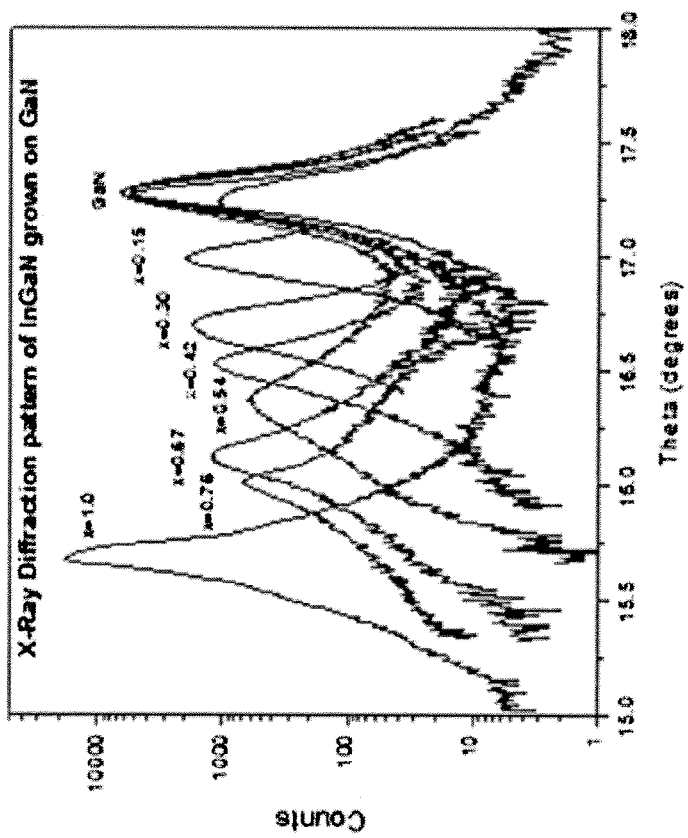
FIG. 12a shows x-ray diffraction pattern measured of In$_x$Ga$_{1-x}$N grown on GaN with indium compositions varying from $0 \leq x \leq 1$.

Reasonably high quality InGaN films were achieved using purchased GaN on Sapphire templates as the starting substrates. This is shown in FIG. 12a from the x-ray diffraction peaks measured for $In_xGa_{1-x}N$ on GaN with Indium composition varying from $0 \leq x \leq 1$. The sharp peaks are indications of high quality films. $In_xGa_{1-x}N$ p-n junction devices were also demonstrated and their photoresponse was measured as shown in FIG. 12b.

What is claimed is:

1. A photon counting avalanche photodiode device comprising:
    a substrate having a pixel matrix of transistor structures on a top surface of the substrate, wherein the top surface of the substrate serves as a contact layer for the device;
    an avalanche region above the substrate comprising doped coalesced nanocolumns having a matching pixel matrix;
    an absorption region with a matching pixel matrix further comprising:
        a grading layer on top of the avalanche region,
        a superlattice layer on top of the grading layer,
        a capping layer on top of the superlattice layer; and
    a plurality of Ohmic contacts that provide individual addressing to the transistor and avalanche photodiode structure pixels.

2. The device of claim 1, wherein the top surface of the substrate is a doped high crystalline quality radiation and temperature hard semiconductor material.

3. The device of claim 2, wherein the top surface of the substrate is gallium nitride.

4. The device of claim 1, wherein the top surface of the substrate has prefabricated transistor structures in a matrix design.

5. The device of claim 4, wherein the transistor structures have areas for growth of the coalesced nanocolumns of the avalanche region.

6. The device of claim 5, wherein the transistor structures are capable of acquiring and amplifying signals from the coalesced nanocolumns of the avalanche region.

7. The device of claim 1, wherein the coalesced nanocolumns are doped with the same or different type of doping as the substrate.

8. The device of claim 1, wherein the coalesced nanocolumns comprise aluminum gallium nitride, gallium nitride, or a combination thereof.

9. The device of claim 1, wherein the coalesced nanocolumns have a doping concentration from $10^{14}$ cm$^{-3}$ to about $10^{18}$ cm$^{-3}$.

10. The device of claim 1, wherein the grading layer serves as a field stop layer.

11. The device of claim 1, wherein the grading layer has an opposite or similar doping type as the substrate and coalesced nanocolumns.

12. The device of claim 11, wherein the superlattice layer and capping layer have the same doping types as the grading layer.

13. The device of claim 1, wherein the capping layer serves as a contact layer for the device.

14. The device of claim 1, wherein the capping layer serves as an optical window layer for the device.

15. The device of claim 1, wherein the capping layer serves as a contact layer for the device structure.

16. The device of claim 1, wherein the capping layer comprises gallium nitride.

17. The device of claim 16, wherein the capping layer has a doping concentration from about $10^{18}$ cm$^{-3}$ to about $10^{19}$ cm$^{-3}$.

18. The device of claim 1, wherein the superlattice layer comprises interdigitated layers of indium gallium nitride, gallium nitride or a combination thereof.

19. The device of claim 18, wherein the superlattice layer has a doping concentration from about $10^{16}$ cm$^{-3}$ to about $10^{18}$ cm$^{-3}$.

20. The device of claim 1, wherein the performance of the absorption region is not affected by any defaults in the absorption region.

21. The device of claim 1, wherein any stacking faults generated at the interface of the coalesced nanocolumns and grading layer propagate along the c-plane of the device layers thus creating grains that will grow to reach the surface or be terminated.

22. The device of claim 21, wherein each grain is electrically connected to only one coalesced nanocolumn.

23. The device in claim 1 fabricated from any other than III-Nitride material system, including other binary and ternary semiconductor materials.

* * * * *